United States Patent [19]

Dinella et al.

[11] 4,081,601
[45] Mar. 28, 1978

[54] BONDING CONTACT MEMBERS TO CIRCUIT BOARDS

[75] Inventors: Donald Dinella, Union; Richard M. Kovaric, Verona, both of N.J.

[73] Assignee: Western Electric Co., Inc., New York, N.Y.

[21] Appl. No.: 672,913

[22] Filed: Apr. 2, 1976

Related U.S. Application Data

[62] Division of Ser. No. 564,007, Mar. 31, 1975, Pat. No. 3,964,666.

[51] Int. Cl.² .............................................. H05K 1/07
[52] U.S. Cl. ................................................. 174/68.5
[58] Field of Search ............... 174/68.5, 52 FP, 50.61; 29/625; 339/176 MF, 275 C

[56] References Cited

U.S. PATENT DOCUMENTS

| | | | |
|---|---|---|---|
| 3,278,887 | 10/1966 | Travis | 339/176 MF |
| 3,515,950 | 6/1970 | Koons et al. | 174/50.61 |
| 3,554,821 | 1/1971 | Caulton et al. | 174/52 FP |
| 3,765,076 | 10/1973 | Brandt | 29/625 |
| 3,781,596 | 12/1973 | Galli et al. | 174/68.5 |

*Primary Examiner*—Bruce A. Reynolds
*Attorney, Agent, or Firm*—W. O. Schellin

[57] ABSTRACT

A circuit pattern on a circuit board has at least one contact finger termination to be coupled to a connector contact. A conductive overlay is solder-bonded to the base metal of the contact finger. The overlay is a composite structure of a number of layers. A base layer of copper faces, and is solder-bonded, to the base. A surface layer of gold provides a contact area for the connector contact. A layer of nickel between the base layer and the surface layer acts as a barrier layer to prevent copper from migrating through the surface layer to deposit as a contaminant on the surface of the contact area.

1 Claim, 4 Drawing Figures

4,081,601

BONDING CONTACT MEMBERS TO CIRCUIT BOARDS

This is a division, of application Ser. No. 564,007 filed Mar. 31, 1975 now U.S. Pat. No. 3,964,666.

BACKGROUND OF THE INVENTION

1. Field of the Invention

The present invention relates to circuit boards and, more particularly, to bonding a non-corrosive surface metal, such as gold, to a contact finger of a circuit board.

2. Description of the Prior Art

In electronic apparatus, electronic components are frequently assembled in functional groups on printed wiring boards also referred to as circuit boards. These boards are commonly equipped with edge-type terminals or contact fingers. When the boards are inserted into respective circuit board connectors, the contact fingers become mechanically and electrically coupled to corresponding contacts in the connectors.

Most electronic logic circuits and many other functional circuits operate on low voltage and low current requirements. Mechanical connections in low voltage circuits tend to experience reliability problems if the conductive material used in respective contact surfaces are metals of the type that are likely to corrode. Corrosion on the contact surfaces tends to cause electrical discontinuities. When the voltages employed in corresponding circuits are insufficient to cause such discontinuities to be cleaned away by electrical arcing, the circuits fail. It is, therefore, common practice in the electronics industry to provide contact surfaces of conductors with non-corroding surface layers. Contact fingers on circuit boards are consequently frequently plated with gold.

Because of the material cost of gold, minimum usage is desirable. Consequently, only contact areas such as the contact finger of a circuit board, are commonly plated with a thin layer of gold after a circuit pattern on the board has been formed by conventional masking and etching techniques.

During such conventional processes and during the subsequent assembly of components to such a board, gold surfaces of the contact fingers at times become damaged. In circuit applications requiring high reliability circuits as, for instance, in communications systems, such damaged contact fingers are inacceptable because of a decreased reliability of the affected board. Repair of the damaged contact fingers by conventional plating methods is in general not possible because of the likelihood of causing further damage to the board and its circuit components during the chemical plating treatment.

Conventional gold plating methods of the contact fingers also require additional masking of the circuit portions not to be plated. The additional step is tedious and adds to the cost of the product. Consequently, in some commercial operations it may not even be feasible to invest in, and to maintain, gold plating facilities for the sole purpose of plating contact fingers.

As it becomes apparent from the above discussion, it is desirable to apply gold top surfaces to contact fingers by other methods than conventional gold plating. An alternative to such conventional methods is particularly desirable for the production of high reliability circuits, and for the repair of gold plated contact fingers that are found to be defective after the assembly of components to their respective boards.

SUMMARY OF THE INVENTION

In accordance with the present invention, a circuit board has a circuit pattern with at least one contact finger for making contact with a connector contact. A conductive overlay is solder-bonded to a conductive base of the contact finger. The overlay includes a base layer of copper which faces and is solder-bonded to the base. A surface layer of gold provides a contact area for the connector contact, and a layer of nickel is located between the surface layer and the base layer to prevent the copper from the base layer from migrating through the surface layer to the surface of the contact area.

BRIEF DESCRIPTION OF THE DRAWING

Other objects and advantages of the invention will become apparent from the following detailed description when considered in conjunction with the appended drawing, wherein.

DETAILED DESCRIPTION

Figure 1:
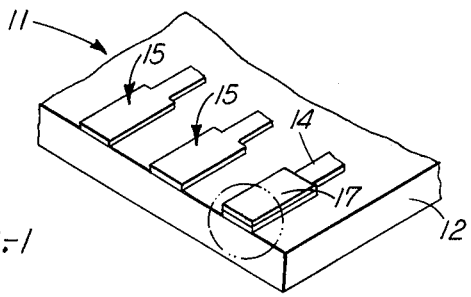
FIG. 1 is a view of a circuit board including a contact finger.

Referring now to FIG. 1 of the drawing, there is shown a portion of a circuit board, which is generally designated by the numeral 11. The circuit board 11 includes an insulating substrate 12 on which a conductive circuit pattern is formed by conventional masking and etching techniques. The substrate 12, in particular, is commonly formed of epoxy-glass or of other insulating materials. However, the substrate 12 can be formed according to well-known techniques on a metal preform covered with epoxy insulating material. On either type of substrate 12, the generation of circuit patterns 14 proceeds according to conventional techniques. The circuit pattern 14 on the board 11 terminates in a number of contact fingers 15. On one of the fingers 15 a gold overlay 17 provides a non-corroding and reliable contact area.

Figure 2:
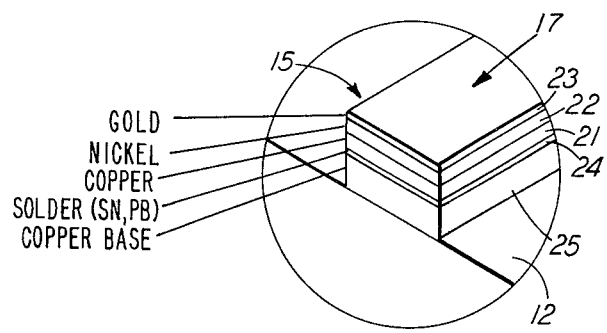
FIG. 2 is an enlarged portion of the contact finger of FIG. 1, showing a composite structure of an overlay attached to the contact finger.

The overlay 17 is a contact member of composite structure, the various layers of which are more clearly shown by exaggerand vertical dimensioning of the contact fingers 15 in FIG. 2. The base material of the overlay 17 is a copper layer 21. One surface of the copper layer 21 faces a nickel layer 22. A gold layer 23 is plated onto the nickel layer 22. The nickel layer 22 serves as a barrier layer between the copper and the gold to prevent the copper from migrating through the gold layer 23 and from depositing on the surface thereof. Such a copper deposit on the surface of the gold layer 23 could eventually corrode to result in reliability problems of the contact fingers 15 and the respective circuit.

The other surface of the copper layer 21 is coated with a solder layer 24. Referring to FIGS. 1 and 2, the solder bonds the overlay 17 to a copper base 25 of the contact fingers 15. The thicknesses of the various layers of the overlay 17 are, of course, variable within a reasonable range of values. In the described embodiment, the preferred thickness of the gold layer 23 is 0.15 to 0.2 thousandths of an inch. The nickel layer 22 is approximately 0.5 thousandths of an inch thick. The copper layer 21 also has a thickness of 0.5 thousandths of an inch and the thickness of the solder is approximately 0.2 thousandths of an inch. The solder is preferably composed of 60 percent tin and 40 percent lead, the alloy melting in a temperature range of approximately 360°–370° F.

The composite structure of the overlay 17 is commercially produced by rolling the nickel and copper layers 22 and 21 into a bi-metallic strip. Next, the solder layer 24 is applied to the open surface of the copper layer 21. Thereafter, the nickel layer is gold plated with the preferred thickness of gold. The resulting raw material is a two inch wide strip which is slit into narrow ribbons from which the gold overlays 17 are stamped and attached to an adhesively coated polyimide film.

Figure 3:
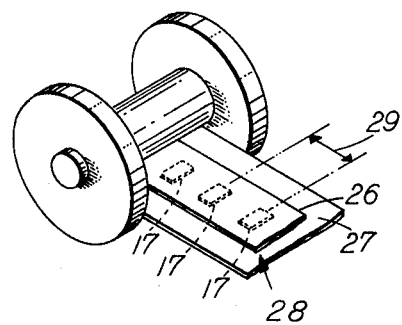
FIG. 3 shows a carrier strip including a plurality of overlays prior to their attachment to contact fingers such as shown in FIG. 1.

Referring to FIG. 3, there is shown a portion of such a polyimide film 26 as it is commercially available from the Dupont deNemours Company, sold under the tradename of "Kapton." The adhesive coating on the film 26 holds a plurality of the overlays 17. A backing tape 27 is placed into contact with the adhesive coating of the film 26 to prevent adhesion of the film when it is rolled onto itself for storage. In FIG. 3, the film 26 with the backing tape 27 is a typical carrier 28 for a plurality of the overlays 17. The overlays 17 are held by the carrier 28 at predetermined intervals 29. Preferably, the intervals 29 correspond to the normal spaces of the contact fingers 15 on the circuit board 11. Such correspondence between the intervals 29 of the overlays 17 on the carrier 28 and the spacing of the contact fingers 15 on the circuit board 11 facilitates the alignment of the overlays 17 to the contact fingers 15.

It is within the scope of this invention to simultaneously apply a plurality of overlays 17 to a corresponding number of contact fingers 15 on the circuit board 11. However, applying a single overlay to a single contact at a time, as it would, for example, be practiced in the repair of the contact fingers 15, lies equally well within the scope of the present invention. The invention is further described with respect to repairing specifically one of such damaged contact fingers 15 of the circuit board 11.

Figure 4:
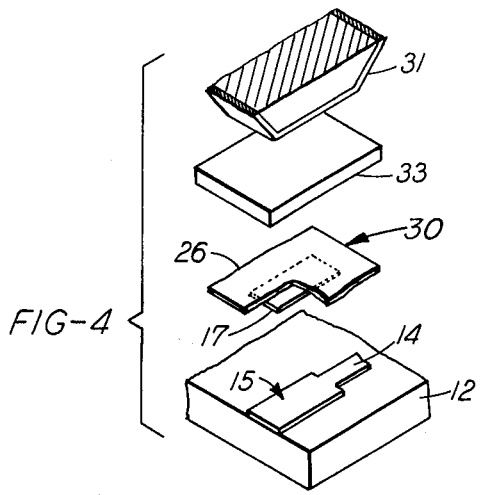
FIG. 4 is a simplified representation of a typical bonding arrangement in accordance with the present invention.

Referring now to FIG. 4, there is shown a portion of the contact board 11, and, in particular, one of the contact fingers 15 located at one edge thereof. The top surface of the contact finger 15 is copper. A prior gold layer has been removed to avoid the formation of a brittle gold-solder alloy which yields a weak and easily broken bond of the overlay 17 to the contact finger 15. The gold is preferably removed by abrasive means.

To apply one of the overlays 17 to the contact finger 15, a portion 30 having one of the overlays 17 attached thereto is cut from the length of the carrier 28 and the backing tape 27 is peeled from its adhesive surface. The overlay 17 attached to the severed portion 30 of the carrier 28 is aligned with the contact finger 15 with the exposed solder surface of the overlay 17 facing the contact finger 15. The adhesive surface of the portion 30 extending beyond the lateral confines of the overlay 17 is then pressed against the circuit board 11 to secure the overlay in alignment with the contact finger 15.

Bonding takes place by applying heat through the film 26. Application of heat liquefies the solder layer 24.

The applied heat is then removed and the solder is permitted to cool until it resolidifies. The film 26 is then removed from the circuit board 11 and from the overlay 17 without difficulty. The overlay 17 remains securely bonded to the gold finger 15.

In making the bond as outlined above, it is desirable to prevent a solder contamination of the gold layer 23 of the overlay 17. Such a contamination tends to occur when the carrier 28 is contacted by a thermode 31 to apply heat through the tape to liquefy the solder. The molten solder then migrates around the edge of the overlay 17 to the top gold surface where it enters and occupies crevices between the adhesive surface of the film 26 and the top surface of the gold layer 23. After the removal of the film 26 from the bonded overlay, solder contamination remains on the top surface of the gold layer. The solder contamination of the top surface of the gold layer 23 is minimized or completely eliminated by the use of a resilient pad 33 which is interposed between a thermode 31 and the carrier portion 30 when the overlay 17 is solder bonded onto the contact finger 15.

The resilient pad 33 is of a silicone rubber, such as the type sold by the Bergquist Company under the tradename "Silpad." This type of silicone rubber is commercially available as a material to mount power transistors to heat sink bases. The particular silicone rubber is electrically insulating but has good thermal transmission characteristics. Particularly significant are the resiliency of the pad 33 and its capacity to transfer heat.

The resiliency of the pad 33 imparts a uniform pressure to the severed carrier portion 30. The portion 30, in turn, urges the overlay 17 into contact with the finger 15. Beyond the confines of the overlay 17, the portion 30 is urged into contact with the substrate 12 and into contact with a portion of the conductor 14 extending beyond the overlay 17. A resulting slight increase in pressure against the carrier portion 30 about the periphery of the overlay 17 is believed to be one of the reasons for successfully preventing solder creepage to the gold top surface of the overlay 17.

The size of the thermode 31 and of the pad 33 determines to a large extent the pressure exerted on the overlay 17 which results from the force imparted by the thermode 31. For a typical overlay 17 being approximately 0.1 by 0.3 inch in size, a force of 2.5 to 3 lbs. is preferred to perform the bonding operation.

The size of the thermode 31 is selected to fully cover the area of the overlay 17. Preferably, both dimensions, the length and the width, of a base surface 35 of the thermode 31 are chosen to be approximately 50% larger than the corresponding dimensions of the overlay 17. The size of the pad 33 is chosen to be at least as large as the base surface 35 of the thermode 31.

The temperature of the thermode 31 is controlled to reach a temperature of approximately 700° F. In applying heat through the pad 33 to the overlay 17 for approximately 4 seconds, the overlay 17 reaches a temperature of about 400° F. The interposed members being the pad 33, having a thickness of approximately 0.012 inch, and the polyimide film 26 of approximately one to two thousandths of an inch. After being heated until the solder is fully liquefied, the heating current is shut off. The force or pressure exerted by the thermode 31 during the heating step is maintained while the contact finger 15 cools until after the solder has resolidified. In the preferred embodiment the pressure is maintained for approximately 16 seconds after the heating current to the thermode has been shut off. It should be realized, however, that cooling times as well as heating times depend on various factors, including the design of the thermode as well on the thicknesses and thermal resistivities of any interposed members, such as the pad 33 or the film 26.

Various other changes and modifications can be made in the described apparatus, product and methods without departing from the spirit and scope of the present invention. The examples given in the detailed description are intended to be illustrative only. The invention is intended to be defined only by the scope of the appended claims.

What is claimed is:

1. A circuit board including a dielectric substrate and a circuit pattern of a conductive base formed in adhesive contact on the substrate, the pattern including at least one contact finger having a top surface area for making contact with a connector contact, wherein an improvement comprises:

a conductive overlay solder-bonded over substantially the entire contact finger top surface area, the overlay including a layer of copper, the copper layer facing and being solder-bonded to the base, a surface layer of gold having a top surface essentially free of solder, the gold providing a contact area for the connector contact, and a layer of nickel located adjacent and between the surface layer and the copper layer for preventing the copper from migrating through the surface layer to the surface of the contact area.

* * * * *